United States Patent
Martinez et al.

(10) Patent No.: US 10,925,164 B2
(45) Date of Patent: Feb. 16, 2021

(54) STACKABLE PASSIVE COMPONENT

(71) Applicant: Apple Inc., Cupertino, CA (US)

(72) Inventors: Paul A. Martinez, Morgan Hill, CA (US); Curtis C. Mead, Sacramento, CA (US); Scott D. Morrison, Watertown, MA (US); Giancarlo F. De La Cruz, San Jose, CA (US); Lin Chen, Saratoga, CA (US); Albert Wang, Sunnyvale, CA (US); Brad W. Simeral, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 590 days.

(21) Appl. No.: 15/702,046

(22) Filed: Sep. 12, 2017

(65) Prior Publication Data

US 2018/0092212 A1    Mar. 29, 2018

Related U.S. Application Data

(60) Provisional application No. 62/398,679, filed on Sep. 23, 2016.

(51) Int. Cl.
*H05K 1/18* (2006.01)
*H03H 1/00* (2006.01)
(Continued)

(52) U.S. Cl.
CPC .............. *H05K 1/181* (2013.01); *H01G 2/06* (2013.01); *H01G 4/30* (2013.01); *H01G 4/40* (2013.01);
(Continued)

(58) Field of Classification Search
CPC ................. H03H 1/0007; H03H 1/02; H03H 2001/0028; H03H 2001/0042; H03H 2001/005; H03H 2001/0078; H03H 2001/0085; H03H 2001/0092; H03H 7/01; H03H 7/0115; H03H 7/0123; H03H 7/0138; H03H 7/38; H03H 7/383; H03H 3/00; H03H 2001/0021; H05K 1/181; H05K 2201/10015; H05K 2201/10022;
(Continued)

(56) References Cited

U.S. PATENT DOCUMENTS 4,821,005 A  *  4/1989  Kling .................... H05K 1/0231
                                                                333/12
4,821,055 A     4/1989  Kling
(Continued)

FOREIGN PATENT DOCUMENTS

EP          0841748 A2  *  5/1998   ............... H01G 4/30
GB          2504337 A   *  1/2014   ............... H03H 3/00

*Primary Examiner* — Jared Fureman
*Assistant Examiner* — Nicolas Bellido
(74) *Attorney, Agent, or Firm* — Fletcher Yoder PC

(57) ABSTRACT

Methods and systems for producing circuitry using stackable passive components are discussed. More specifically, the present disclosure provides designs and fabrication methods for production of stackable devices that may be used as components in circuitry such as filters and impedance matching adaptors. Such components may be used to save space in printed circuit boards. Moreover, stackable passive components may be dual components, which may be improve the electrical performance in certain types of circuits such as matched component filters.

20 Claims, 8 Drawing Sheets

(51) Int. Cl.
    *H03H 7/01* (2006.01)
    *H03H 7/38* (2006.01)
    *H05K 3/34* (2006.01)
    *H01G 4/30* (2006.01)
    *H01G 2/06* (2006.01)
    *H01G 4/40* (2006.01)
    *H01G 4/228* (2006.01)
    *H01G 4/12* (2006.01)
    *H01F 27/29* (2006.01)

(52) U.S. Cl.
    CPC ............ *H03H 7/0115* (2013.01); *H03H 7/38* (2013.01); *H05K 3/3436* (2013.01); *H01F 27/29* (2013.01); *H01G 4/12* (2013.01); *H01G 4/228* (2013.01); *H03H 1/00* (2013.01); *H03H 2001/0085* (2013.01); *H05K 2201/1003* (2013.01); *H05K 2201/1006* (2013.01); *H05K 2201/10015* (2013.01); *H05K 2201/10022* (2013.01); *H05K 2201/10515* (2013.01); *H05K 2201/10636* (2013.01); *Y02P 70/50* (2015.11)

(58) Field of Classification Search
    CPC ... H05K 2201/1003; H05K 2201/1006; H05K 2201/10515; H05K 2201/10636; H05K 3/3436; Y02P 70/613; H01F 27/40; H01F 38/12; H01G 4/018; H01G 4/06; H01G 4/08; H01G 4/12; H01G 4/1209; H01G 4/1218; H01G 4/1227; H01G 4/1236; H01G 4/1245; H01G 4/1254; H01G 4/1263; H01G 4/1272; H01G 4/1281; H01G 4/129; H01G 4/28; H01G 4/30

USPC .................. 361/270, 301.4, 312, 313, 321.2; 29/25.41

See application file for complete search history.

(56) References Cited

U.S. PATENT DOCUMENTS

| | | |
|---|---|---|
| 5,068,631 A | 11/1991 | Vince |
| 7,309,913 B2 | 12/2007 | Shim et al. |
| 7,942,700 B2 | 5/2011 | Gutierrez et al. |
| 8,767,408 B2* | 7/2014 | Arnold .................... G06F 1/183 361/761 |
| 9,743,522 B2 | 8/2017 | Li et al. |
| 2005/0185360 A1 | 8/2005 | Purple et al. |
| 2006/0113653 A1 | 6/2006 | Xiaoqi et al. |
| 2007/0187844 A1 | 8/2007 | Chen |
| 2008/0210743 A1 | 9/2008 | Lee et al. |
| 2009/0078456 A1 | 3/2009 | Macropoulis et al. |
| 2010/0301473 A1 | 12/2010 | Sasaoka |
| 2011/0134613 A1 | 6/2011 | Moussaoui et al. |
| 2011/0248397 A1 | 10/2011 | Coffy et al. |
| 2012/0169433 A1* | 7/2012 | Mullins ................ H03H 7/0115 333/181 |
| 2012/0262145 A1 | 10/2012 | Chen et al. |
| 2013/0329388 A1* | 12/2013 | Dogauchi ............ H05K 3/3442 361/767 |
| 2016/0163455 A1* | 6/2016 | Iwama .................... H01G 4/012 361/301.4 |
| 2017/0208690 A1* | 7/2017 | Martinez ................ H01G 2/065 |
| 2017/0208710 A1* | 7/2017 | Wang .................... H01R 43/205 |
| 2020/0234887 A1* | 7/2020 | Muramatsu ............ H01G 4/012 |

\* cited by examiner

STACKABLE PASSIVE COMPONENT

CROSS REFERENCE TO RELATED APPLICATIONS

This application is a Non-Provisional Patent Application of U.S. Provisional Patent Application No. 62/398,679, entitled "STACKABLE PASSIVE COMPONENT", filed Sep. 23, 2016, which is herein incorporated by reference.

BACKGROUND

The present disclosure relates generally to stackable passive components for electrical circuitry. More specifically, this disclosure relates to designs of components such as resistors, capacitors, and inductors that may be used for the construction of electrical circuits that may occupy less space and/or present improved electrical performance.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electrical devices may employ circuitries implemented using passive components. Some of these circuitries, such as filters and impedance matching adaptors, may include in their design multiple components that may have similar characteristics. For example, a filter may have a design that employs two capacitors having substantially similar specifications for a capacitance. Variations in the production of electrical components may lead to deviations in the characteristic of component from its specification, leading ultimately to loss of performance in the circuitry. Moreover, circuitries that employ multiple passive components may reserve a pad in a substrate (e.g., printed circuit board) of a device. This arrangement may occupy a significant space in the printed circuit board of the electrical device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first example, an electrical device is described. The electrical device may include a passive component having two electrical terminals. The first terminal may be used to couple the passive component to the substrate. The electrical device may have an electrical component that has a third terminal coupled to the second terminal of the passive component. The arrangement of the passive component, the electrical component, and the substrate is such that that the electrical component is physically disconnected from the substrate.

In another example, a dual component device is described. The device may have a first passive electrical component having two terminals disposed in first and second surfaces of the dual component device that are opposite to each other. The dual component device may also have a second passive electrical component comprising two terminal disposed in the same first and second surfaces of the dual component device as the first passive electrical component.

A method to produce a filter circuitry is also discussed. The method may have a process for producing a dual component device having a first passive component having a first and a second terminal, and a second passive component having a third and fourth terminal. The method may also have a process for attaching an electrical component to the dual component device such that a fifth terminal of the electrical component may be coupled to the first terminal and a sixth terminal of the electrical component may be coupled to the third terminal. The method may have also a process for attaching the dual component device to a printed circuit board such that the electrical component is physically disconnected from the printed circuit board, and the second and fourth terminals of the dual component device are coupled to the printed circuit board.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices include circuitries that may use multiple passive components. In some circuitries, the passive components may be implemented as discrete components. For example, a circuitry may be design to include discrete inductors, resistors, or capacitors soldered to a printed circuit board. Examples provided herein provide descriptions of passive components that may be stacked. For example, a passive component may configured such that it may be coupled to a substrate (e.g., a printed circuit board) through electrical terminations in the bottom of the passive component, and directly to another electrical component through the electrical terminations in the top of the passive component.

This architecture may present space saving features. In many cases, discrete passive components may each occupy a footprint in the printed circuit board, which may lead to an enlarge printed circuit board. By using stackable components, a discrete electrical component may be stacked above another passive component, which may be itself attached to a printed circuit board. Since the first electrical component is physically disconnected from the printed circuit board, as it is stacked above another printed circuit board, the footprint of a circuitry may be reduced by employing stackable passive components, as described herein.

Moreover, some circuitries may employ multiple passive components having substantially similar specifications. For example, a filter may be designed such that they include two capacitors having similar specifications. Minor deviations in the production of the capacitors may lead to reduction in the performance of the filter. More generally, minor variations in the passive discrete components may lead to reduction in the performance of the electrical circuitry that employs them. In some of the examples described herein, packaged stackable devices may include multiple components that may be matched. Production of multiple components in the same package may substantially reduce the variations between the multiple components, improving their matching and, ultimately the performance of the circuitry employing them.

Figure 1:
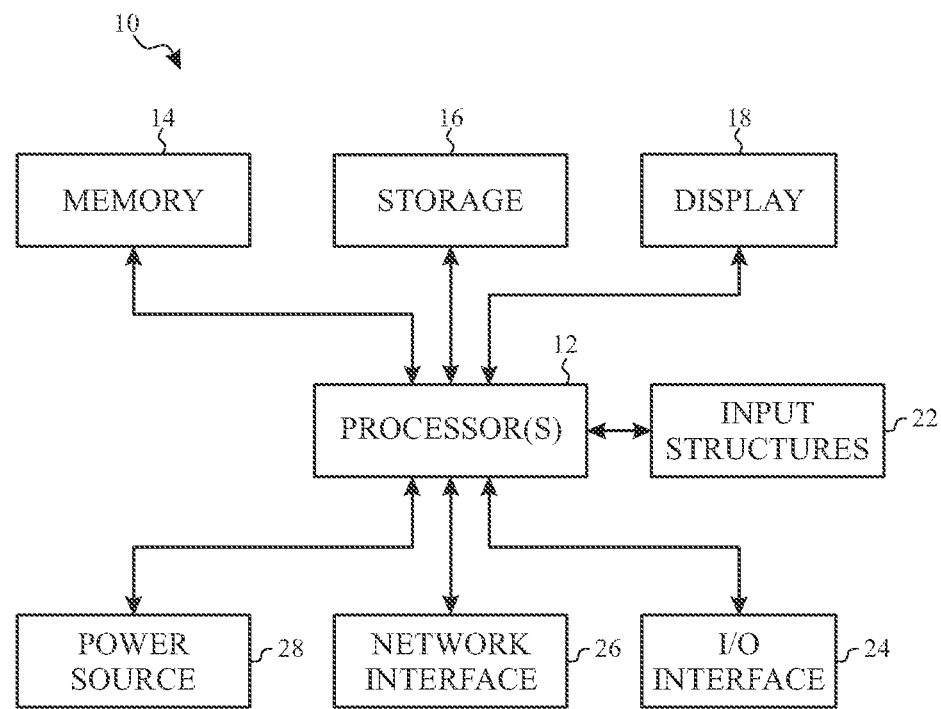
FIG. 1 is a diagram of an electrical device that may benefit from the inclusion of stackable passive components, in accordance with an embodiment.

With the preceding in mind, a general description of suitable electronic devices that may employ stackable passive components as the ones described herein is provided. FIG. 1 is a block diagram of an electronic device 10, in accordance with an embodiment of the present disclosure. The electronic device 10 may include, among other things, one or more processor(s) 12, memory 14, storage or nonvolatile storage 16, a display 18, input structures 22, an input/output (I/O) interface 24, network interface 26, and a power source 28. The various functional blocks shown in FIG. 1 may include hardware elements (including circuitry), software elements (including computer code stored on a computer-readable medium), or a combination of both hardware and software elements. Many of the circuitry of the hardware elements of the various functional blocks of FIG. 1 may employ stackable passive components to improve the efficiency in space utilization and/or to improve matching between multiple components within the hardware elements. It should be noted that FIG. 1 is merely one example of a particular implementation and is intended to illustrate the types of components that may be present in electronic device 10.

Figure 2:
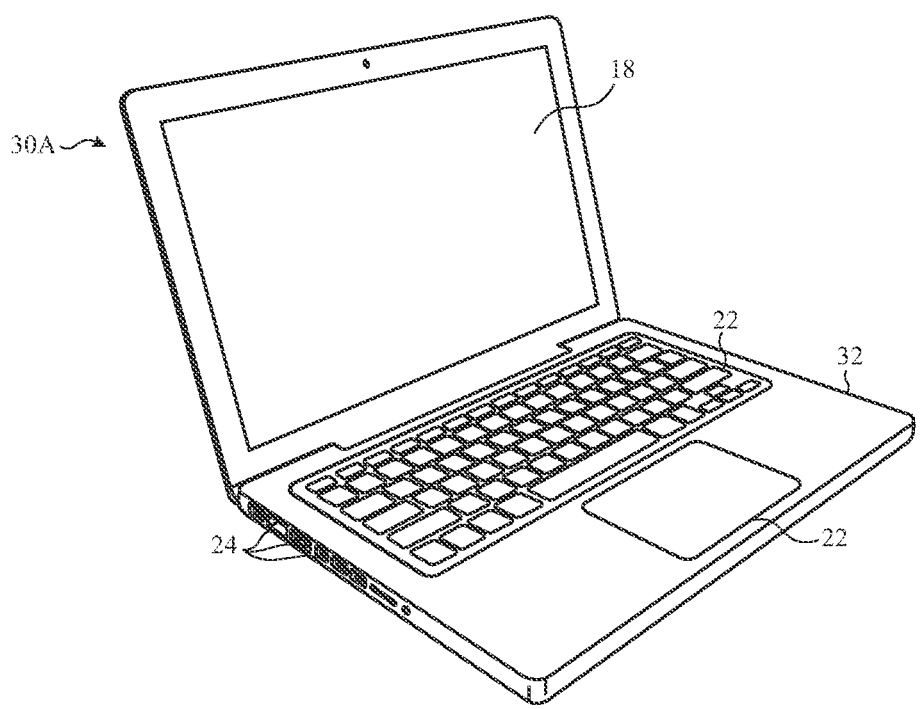
FIG. 2 is a perspective view of a notebook computer that may benefit from the inclusion of stackable passive components, in accordance with an embodiment.
Figure 3:
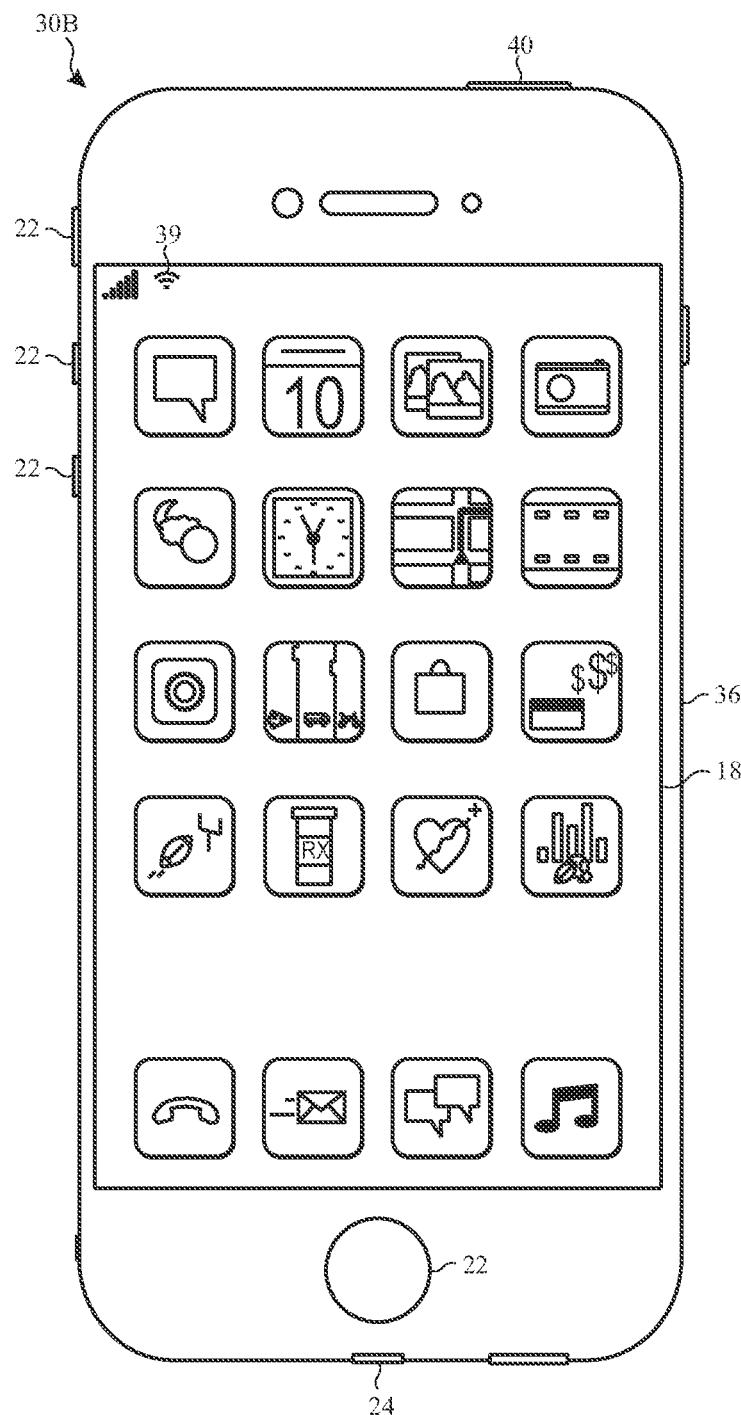
FIG. 3 is a front view of a hand-held device that may benefit from the inclusion of stackable passive components, in accordance with an embodiment.
Figure 4:
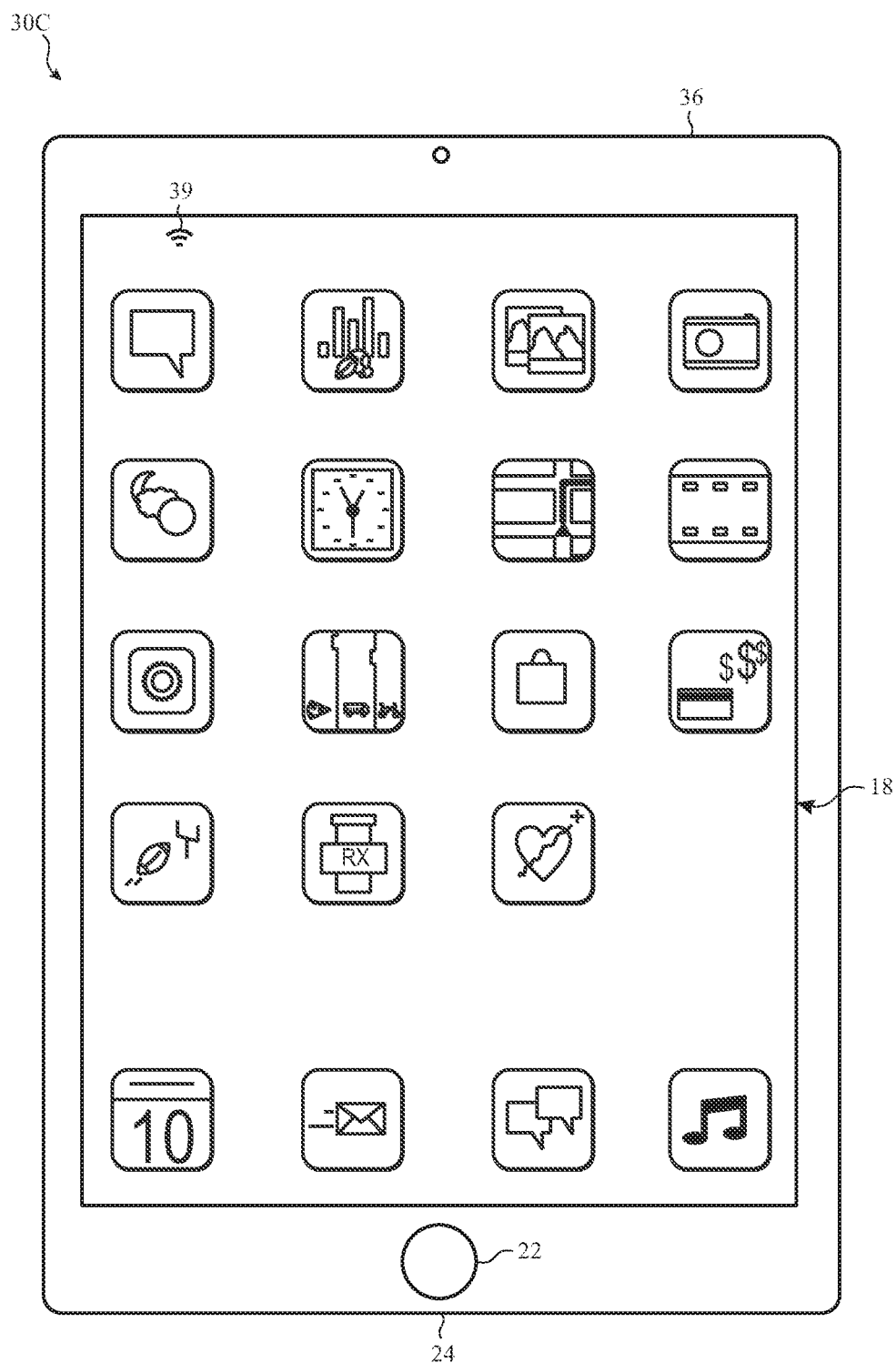
FIG. 4 is a front view of portable tablet computer that may benefit from the inclusion of stackable passive components, in accordance with an embodiment.
Figure 5:
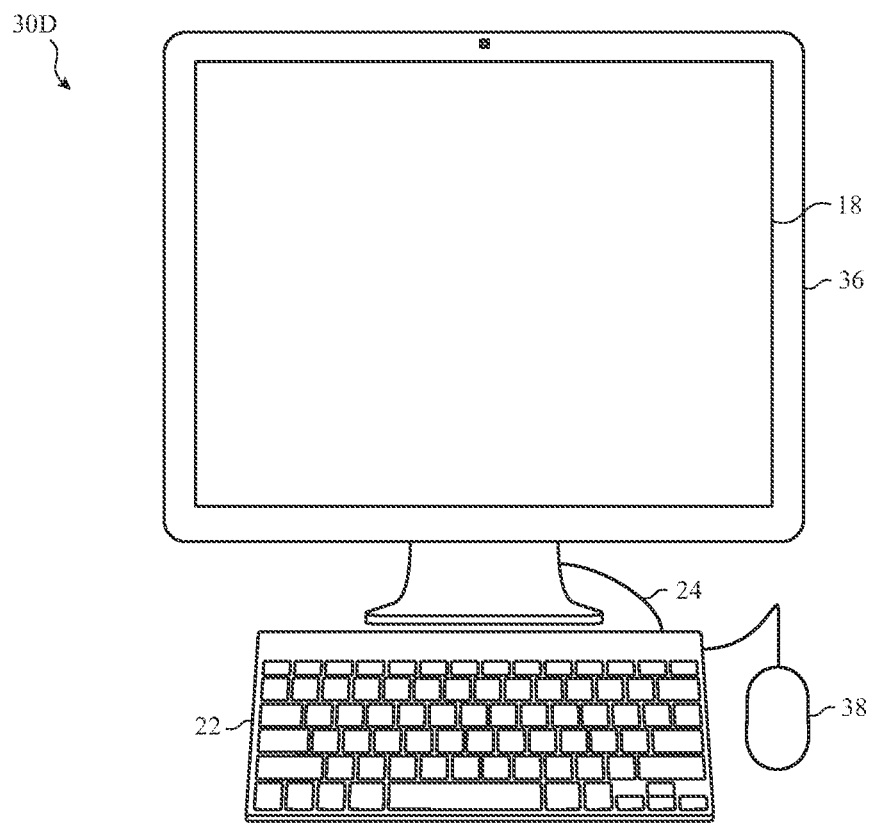
FIG. 5 is a diagram of a desktop computer that may benefit from the inclusion of stackable passive components, in accordance with an embodiment.
Figure 6:
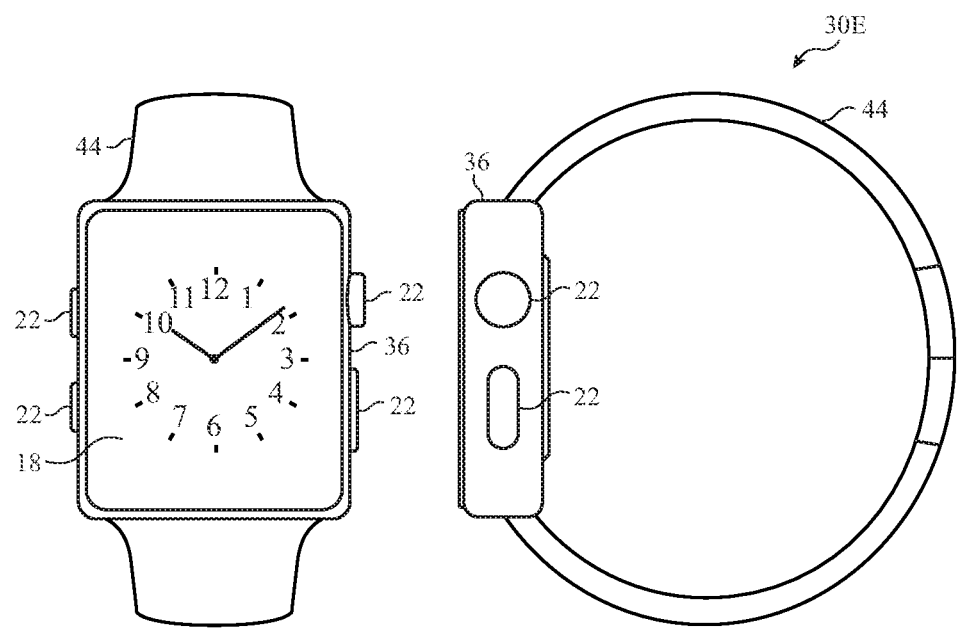
FIG. 6 presents a front and a side view of a wearable electrical device that may benefit from the inclusion of stackable passive components, in accordance with an embodiment.

By way of example, the electronic device 10 may represent a block diagram of a notebook computer 30A depicted in FIG. 2, handheld devices 30B, 30C depicted in FIG. 3 and FIG. 4, a desktop computer 30D depicted in FIG. 5, a wearable electronic device 30E depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile storage 16 to perform various algorithms. Such programs or instructions executed by the processor(s) 12 may be stored in any suitable article of manufacture or computer program product that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Moreover, programs (e.g., an operating system) encoded on the memory 14 or the nonvolatile storage 16 may also include instructions that may be executed by the processor(s) 12 to allow the electronic device 10 to provide various functionalities.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED, OLED, AMOLED, etc.) displays, or some combination of LCD panels and LED panels.

The input structures 22 of the electronic device 10 may allow a user to interact with the electronic device 10 (e.g., pressing a button to increase or decrease a volume level). The I/O interface 24 may allow electronic device 10 to interface with various other electronic devices. The I/O interface 24 may include various communications interfaces, such as universal serial bus (USB) ports, serial communications ports (e.g., RS232), Apple's Lightning® connector, or other communications interfaces. The network interface 26 may also allow electronic device 10 to interface with various other electronic devices and may include, for example, interfaces for a personal area network (e.g., PAN), such as a Bluetooth network, for a local area network (e.g., LAN) or wireless local area network (e.g., WLAN), such as an 802.11x Wi-Fi network, and/or for a wide area network (e.g., WAN), such as a 3rd generation (e.g., 3G) cellular network, 4th generation (e.g., 4G) cellular network, or long term evolution (e.g., LTE) cellular network. The network interface 26 may include an interface for, for example, broadband fixed wireless access networks (e.g., WiMAX), mobile broadband Wireless networks (e.g., mobile WiMAX), asynchronous digital subscriber lines (e.g., ADSL, VDSL), digital video broadcasting-terrestrial (DVB-T) and its extension DVB Handheld (DVB-H), Ultra-Wideband (UWB), alternating current (AC) power lines, and so forth.

In some applications, input structures 22, the I/O interfaces 24 and/or network interfaces 26 may employ radiofrequency (RF) circuitry modules. The I/O interfaces 24 and network interfaces 26 may include high-frequency circuitries to implement certain functions related with data communication. In some of these systems, a filter may be employed to prevent undesired behavior from noise or external interference. To that end, filters employing stackable passive components with improved matching specifications may be used to obtain improved performance and reduced footprint in the electrical device. As further illustrated, the electronic device 10 may include a power source 28. The power source 28 may include any suitable source of power, such as a rechargeable lithium polymer (e.g., Li-poly) battery and/or an alternating current (e.g., AC) power converter. The power source 28 may be removable, such as a replaceable battery cell.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of the notebook computer 30A, is illustrated in FIG. 2 in accordance with an embodiment of the present disclosure. The depicted computer 30A may include a housing or enclosure 32, a display 18, input structures 22, and ports of the I/O interface 24. In one embodiment, the input structures 22 (e.g., such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents an embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif. FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

The handheld devices 30B and 30C may each include similar components. For example, an enclosure 36 may protect interior components from physical damage. Enclosure 36 may also shield the handheld devices 30B and 30C from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a connector and protocol, such as the Lightning connector provided by Apple Inc., a universal service bus (e.g., USB), one or more conducted radio frequency connectors, or other connectors and protocols.

User input structures 22, 40, in combination with the display 18, may allow a user to control the handheld devices 30B or 30C. For example, the input structure 40 may activate or deactivate the handheld device 30B or 30C, one of the input structures 22 may navigate a user interface of the handheld device 30B or 30C to a home screen, a user-configurable application screen, and/or activate a voice-recognition feature of the handheld device 30B or 30C, while other of the input structures 22 may provide volume control, or may toggle between vibrate and ring modes. In the case of the handheld device 30B, additional input structures 22 may also include a microphone may obtain a user's voice for various voice-related features, and a speaker to allow for audio playback and/or certain phone capabilities. Portable devices 30B and 30C may include the stackable passive components described herein to improve the efficiency in space utilization.

Turning to FIG. 5, a computer 30D may represent another embodiment of the electronic device 10 of FIG. 1. The computer 30D may take any suitable form of computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 36 may be provided to protect and enclose internal components of the computer 30D such as a dual-layer display. In certain embodiments, a user of the computer 30D may interact with the computer 30D using various peripheral input devices, such as input structures 22 (e.g., the keyboard or mouse 38), which may connect to the computer 30D via a wired I/O interface 24 and/or wireless I/O interface.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen (e.g., LCD, OLED display, active-matrix organic light emitting diode (e.g., AMOLED) display, and so forth), which may allow users to interact with a user interface of the wearable electronic device 30E.

Figure 7A:
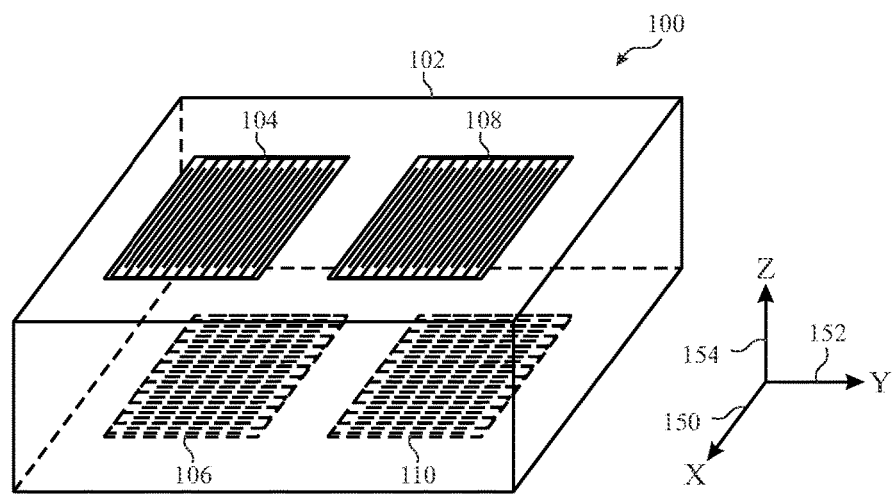
FIG. 7A presents a perspective view of a termination layout of a stackable passive component, in accordance with an embodiment.

With the preceding in mind, the diagram 100 in FIG. 7A depicts a perspective view of a stackable passive component 102. The perspective view is illustrated with respect to a horizontal direction 150, a transversal direction 152, and a vertical direction 154. Stackable passive component 102 may include a first passive electrical component with a top terminal 104 and a bottom terminal 106. Stackable passive component 102 may also include a second electrical component having a top terminal 108 and a bottom terminal 110. In some implementations, the stackable passive component 102 may be mounted to a pad of a printed circuit board, and top terminals 104 and 108 may be pads for another electrical component. Note that multiple stackable passive components may be stacked based on the desired electrical circuitry.

The stackable passive component 102 illustrated includes two passive electrical components. Passive electrical components may be two capacitors, two inductors, a capacitor and an inductor, a resistor and a capacitor or any other set of passive electrical components. For example, if using multilayer ceramic techniques in the construction, the first component may be an inductor between terminals 104 and 106, and may be implemented by a route within stackable passive component 102 having a desired inductance between terminals 104 and 106.

Figure 7B:
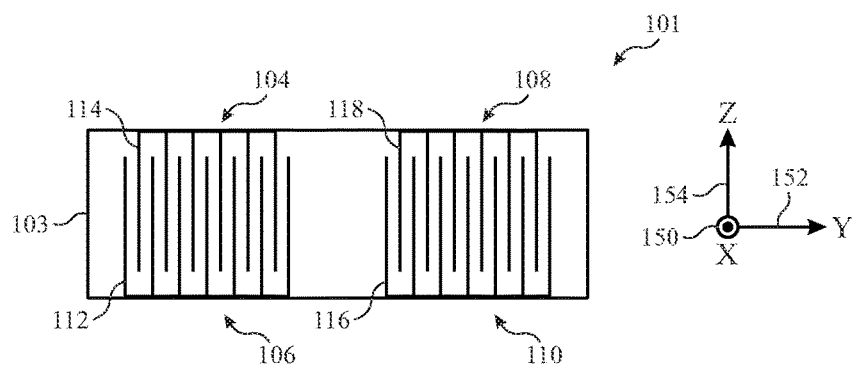
FIG. 7B presents a side view of a stackable dual capacitor component that may have a layout similar to the one of FIG. 7A, in accordance with an embodiment.

Diagram 101 in FIG. 7B depicts a side view (i.e., along the direction of horizontal direction 150) of a stackable passive component 102. Specifically, diagram 101 illustrates a stackable dual capacitor 103 having terminals similar to that of stackable passive component 102. Stackable dual capacitor 103 may have a first capacitor between terminals 104 and 106 that is formed by electrodes 112 that are coupled to bottom terminal 106 and electrodes 114 that are coupled to top terminal 104. Stackable dual capacitor 103 may also have a second capacitor formed between terminals 108 and 110. This capacitor is formed by electrodes 116 that are coupled to terminal 110, and electrodes 118 that are coupled to terminal 108.

Note that the stackable dual capacitor 103 may be a single package. The stackable dual capacitor 103 may be formed from solid-state materials in some implementations. In other implementations, ceramic sheets may be used to form a multilayer ceramic capacitor device having ceramic materials as dielectric between electrodes 112 and 114 and electrodes 116 and 118. Since the fabrication of both capacitors is very similar, as both capacitors are part of the same stackable dual capacitor 103, the characteristics of the capacitor may be matched to a high degree. This may lead to improved performance when using the stackable dual capacitor 103 in a filter.

Moreover, since the parameters of a capacitor are related to the distance between electrodes and the dimensions of each electrode, the fabrication of stackable dual capacitor 103 may be adjusted to produce a system where the capacitance measured between terminals 104 and 106 may be a multiple (e.g., the same, double, triple, etc.) of the capacitance measured between terminals 108 and 110. Other fixed ratios may also be chosen. As discussed above, the uniformity in fabrication may lead to improved accuracy in the chosen ratios.

Figure 8A:
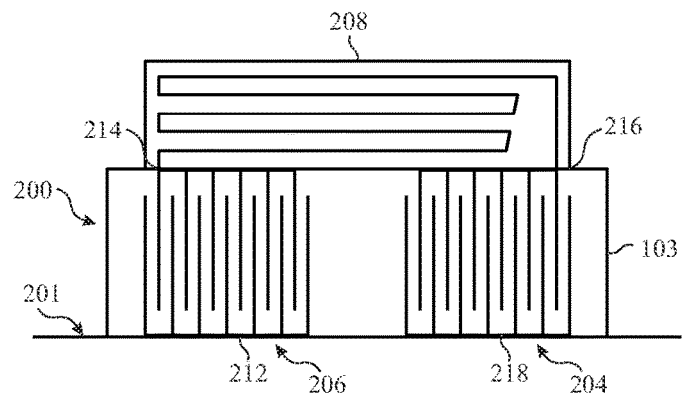
FIG. 8A presents an implementation of a filter circuitry employing stackable passive components, in accordance with an embodiment.

As an example of a circuitry employing stackable passive components, FIG. 8A illustrates an implementation of a pi filter 200 mounted on a printed circuit board 201. Pi filter 200 may be constructed from capacitor 204 and 206 in series with inductor 208. Both capacitors 204 and 206 may be implemented within a stackable dual capacitor 103. Inductor 208 may then be used to close the circuit. As detailed below and illustrated in electrical diagram 202 for pi filter 200, the circuit of pi filter 200 goes from terminal 212 to terminal 214 through capacitor 206, from terminal 214 to terminal 216 through inductor 208 and from terminal 216 to terminal 218 through capacitor 204.

As discussed above with respect to FIG. 7B, each of capacitors 204 and 206 may have a bottom terminal and a top terminal. In this example, bottom terminal for capacitor 206 may be coupled to the printed circuit board 201 in terminal 212. Similarly, bottom terminal for capacitor 204 may be coupled to the printed circuit board 201 in terminal 218. Terminals 214 and 216 located in the top of the stackable dual capacitor 103 provide a pad for attachment of inductor 208. Note that inductor 208 do not occupy any additional footprint in printed circuit board 201. Note further that, as discussed above, capacitors 204 and 206 may have substantially matched capacitances, resulting in a pi filter 200 with improved performance.

Figure 9A:
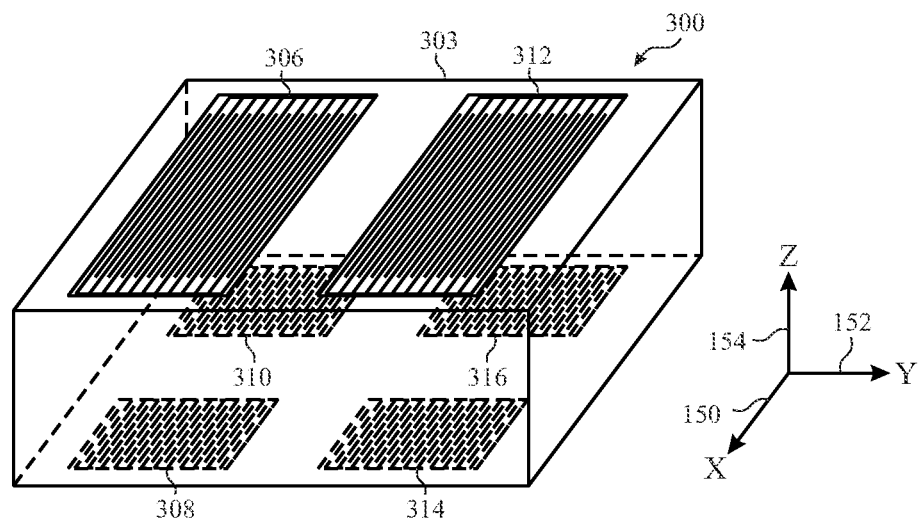
FIG. 9A presents a perspective view of another layout for a stackable passive component, in accordance with an embodiment.

A diagram 300 in FIG. 9A depicts a perspective view of another example of stackable passive component 303. This perspective view is illustrated with respect to a horizontal direction 150, a transversal direction 152, and a vertical direction 154. Stackable passive component 303 may include two components and each component may be associated with three terminals. Top terminal 306 and bottom terminals 308 and 310 may be substantially coupled with the first component of the stackable passive component 303. Similarly, top terminal 312 and bottom terminals 314 and 316 may be substantially coupled to the second component of the stackable passive component 303.

The two components in the stackable passive component 303 may be two-terminal components. In such implementations, terminal 306 and 310 may be coupled internally through a low resistance route (e.g., 318) and/or terminal 312 and 316 may be coupled internally through a low resistance route (e.g., 318), as detailed below. With this implementation, both terminals of the components in the stackable passive component 303 may be coupled to a printed circuit board. This may allow circuits in which the passive component may be arranged in parallel (e.g., parallel circuit branch) with a component stacked above stackable passive component 303.

Figure 9B:
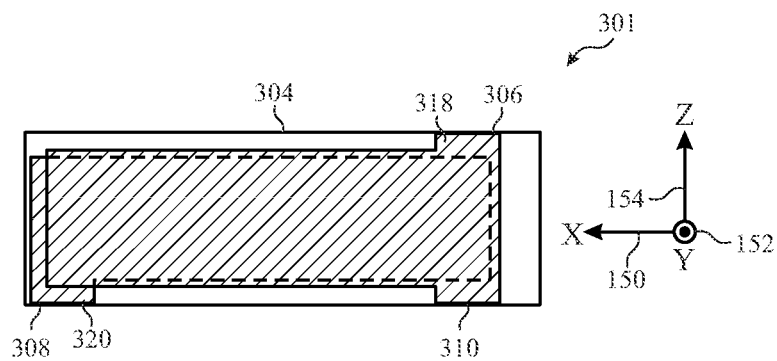
FIG. 9B presents a side view of stackable dual capacitor component that may have a layout similar to the one of FIG. 9A, in accordance with an embodiment.
Figure 9C:
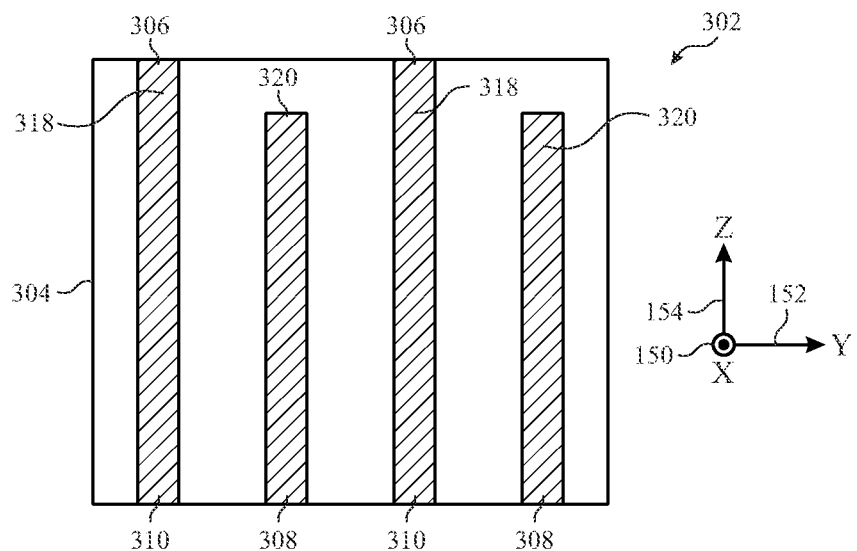
FIG. 9C presents a front view of a stackable dual capacitor component of FIG. 9B, in accordance with an embodiment.

FIGS. 9B and 9C provide a side view 301 and a front view 302 of a stackable package capacitor 304 that may have a terminal layout similar to the one of stackable passive component 303. The capacitor may have a set of electrodes 318 that are coupled to top terminal 306 and bottom terminal 310. The capacitor may also have a set of electrodes 320 that are coupled to bottom terminal 308. As can be seen in front view 302, both sets of electrodes 318 and 320 present a separation along the transversal direction 152, which creates the capacitive coupling of the capacitor. Note further that, as can be seen in side view 301, both terminals 308 and 310 present a separation along the horizontal direction 150, which prevents short circuit between both terminals. Finally, as can be seen in side view 301, note that electrodes 318 connect to both top terminal 306 and bottom terminal 310, producing a low resistance connection between terminals 306 and 310, as discussed above.

Figure 10A:
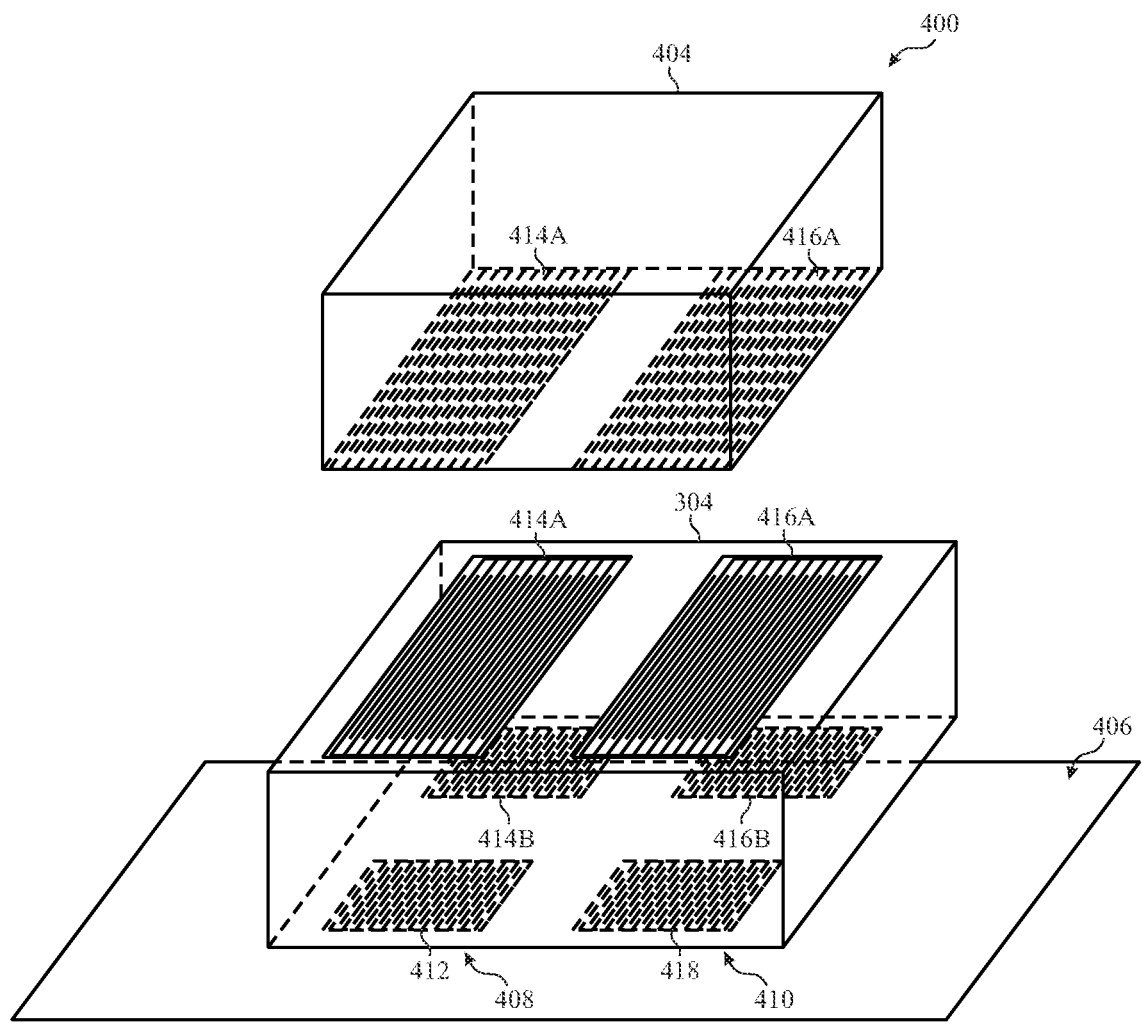
FIG. 10A presents an implementation of a filter circuitry that employs stackable passive components, in accordance with an embodiment.
Figure 10B:
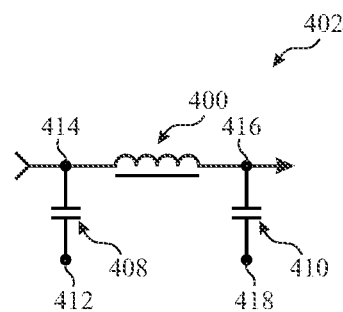
FIG. 10B presents an electrical diagram of the filter circuitry of FIG. 10A, in accordance with an embodiment.

FIG. 10A depicts an implementation of a pi filter 400 that employs a stackable dual packaging capacitor 304 coupled to an inductor 404 and a printed circuit board 406. FIG. 10B illustrates an electrical diagram 402 of the pi filter 400. The circuit may be have four terminals 412, 414, 416 and 418 of the pi filter connected directly to the printed circuit board 406. A capacitor 408 is disposed between terminals 412 and 414, a capacitor 410 is disposed between terminals 416 and 418, and inductor 404 may be disposed between terminals 414 and 416.

Figure 8B:
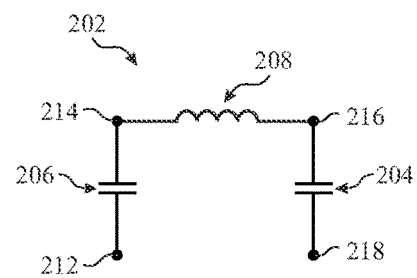
FIG. 8B presents an electrical diagram of the filter circuitry of FIG. 8A, in accordance with an embodiment.

Note that, as can be seen in electrical diagram 402, pi filter 400 has inductor terminals 414 and 416 connected to a route of the printed circuit board, in contrast with pi filter 200 of FIGS. 8A and 8B in which only terminals 212 and 218 are connected to a printed circuit board 406. This implementation may be realized using a stackable dual packaging capacitor 304 in which terminals 414A and 414B are internally coupled and terminals 416A and 416B are internally coupled, as discussed above with respect to FIGS. 9A-C. Note further that terminal 412 and 418 are also available for routing in the printed circuit board 406. In some implementations, terminals 412 and 418 may be coupled to a ground connection of the printed circuit board 406, such as ground layer. This implementation for pi filter 400 reduces the footprint of the circuitry in the printed circuit board 406 relative to a similar implementation without stacking, while still allowing all terminals 412, 414, 416, and 418 to be connected to the printed circuit board.

Figure 11:
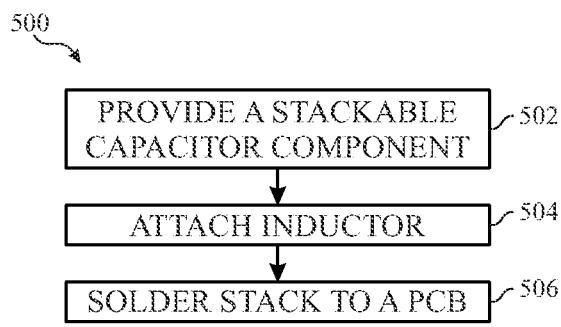
FIG. 11 presents a method to produce a filter using stackable passive components, in accordance with an embodiment.

A method 500 to produce a filter using passive components, such as the ones illustrated in FIGS. 8A and 10A, is illustrated in FIG. 11. The method may have a process to provide a stackable capacitor component (block 502). The capacitor component may be attached to a stackable inductor component (block 504). Attachment may be realized through direct welding of terminals, solder ball, or any other method appropriate with the package of the stackable capacitor component and the stackable inductor component. The stack may then be soldered to a printed circuit board (block 506). Note that stackable capacitor component and stackable inductor components may be a part of a stackable dual passive component package, as discussed above. Note also that the components may be chosen based on the electrical circuitry that is appropriate for the application.

Figure 12:
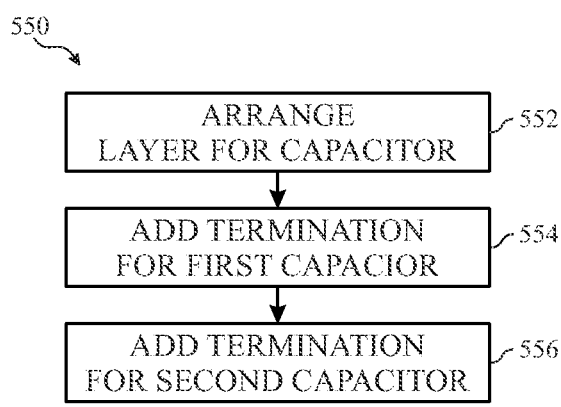
FIG. 12 presents a method to produce a stackable capacitor, in accordance with an embodiment.

Moreover, a method 550 to produce stackable dual capacitors such as the ones illustrated in FIG. 7B and FIGS. 9B-C is illustrated in FIG. 12. This method may be used to produce, for example stackable dual capacitors using multilayer ceramic technology. The method may have a process to arrange layers of a capacitor (box 552). The layers may be dielectric layers or electrode layers, and they may be disposed to form capacitive structures, such as the arrangements of electrodes illustrated in FIG. 7B and in FIGS. 9B-C. While the figures illustrated provide arrangements having vertical electrodes, horizontal electrodes are also contemplated.

Once the body of the capacitor is formed, terminals for the first capacitor (box 554) may be provided through deposition of a metal in the appropriate regions of the capacitor. Terminal for the second capacitor may also be provided (box 556) through a similar process. Care may be taken to avoid unintended short-circuits between the terminals of the first and the second capacitors.

Method 550 may be modified for the production of stackable dual inductor packages and stackable dual resistor packages, as well as more general dual components, as discussed above. To that end, the conductive regions of the ceramic layers may be arranged in the appropriate manner to form a resistor, or an inductor. For example, a dual package having one capacitor and one resistor may be produced using a modification of method 550.

Benefits of some of the examples illustrated herein include the use of packaging mechanisms that may save footprint of passive component circuitry in printed circuit boards. Some examples may also improve the matching of characteristics of passive components (e.g., resistance, inductance, capacitance, etc . . . ) through the use packaging having dual components. As a result, improved electrical performance and reduced dimensions may be expected from electrical devices employing the systems and methods described herein.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electrical device comprising:
   a first electrical component comprising:
   a first electrode disposed within the first electrical component and coupled to a first electrical terminal on a first side of the first electrical component and a second electrical terminal on a second side of the first electrical component; and
   a second electrode disposed within the first electrical component next to the first electrode and coupled to only a third electrical terminal on the first side of the first electrical component; and
   a second electrical component stacked above the first electrical component, wherein the second electrical component comprises a fourth electrical terminal coupled to the second electrical terminal, wherein the second electrical component is physically separated from a substrate.

2. The electrical device of claim 1, wherein the substrate comprises a printed circuit board.

3. The electrical device of claim 1, comprising a filter that comprises the first electrical component and the second electrical component.

4. The electrical device of claim 1, wherein the first electrical component comprises a capacitor, an inductor, a resistor, or any combination thereof.

5. The electrical device of claim 1, comprising a dual component device that comprises the first electrical component and a passive component.

6. The electrical device of claim 5, wherein the first electrical component comprises a first capacitor and the passive component comprises a second capacitor.

7. The electrical device of claim 6, wherein the second electrical component comprises an inductor, and wherein the electrical device comprises a pi filter that comprises the first capacitor, the second capacitor, and the inductor.

8. The electrical device of claim 6, wherein a capacitance of the first capacitor is substantially similar to a capacitance of the second capacitor.

9. A dual component device comprising:
   a first passive electrical component comprising:
   a first terminal on a first surface of the dual component device;
   a second terminal on the first surface next to the first terminal; and a third terminal on a second surface of the dual component device that is opposite the first surface of the dual component device, wherein the third terminal is opposite the first terminal and the second terminal; and a second passive electrical component comprising:
  a fourth terminal on the first surface next to the first terminal;
  a fifth terminal on the first surface next to the second terminal and the fourth terminal; and
  a sixth terminal on the second surface next to the third terminal, the sixth terminal opposite the fourth terminal and the fifth terminal.

10. The dual component device of claim 9, wherein the first terminal, the second terminal, the fourth terminal, and the fifth terminal are disposed in a grid pattern on the first surface.

11. The dual component device of claim 9, wherein the first passive electrical component comprises a first capacitor, wherein the second passive electrical component comprises a second capacitor, and wherein a capacitance of the first capacitor and the second capacitor are set to a fixed ratio.

12. The dual component device of claim 11, wherein the fixed ratio is 1.

13. The dual component device of claim 9, wherein the first passive electrical component comprises an inductor or a resistor.

14. The dual component device of claim 9, wherein the dual component device comprises ceramic layers.

15. The dual component device of claim 9, wherein the second terminal and the third terminal are directly coupled and the first terminal and the second terminal are capacitively coupled.

16. The dual component device of claim 9, wherein the fifth terminal and the sixth terminal are coupled through a low resistance route disposed inside the dual component device.

17. The dual component device of claim 16, wherein the second passive electrical component comprises a set of electrodes arranged in a vertical direction, and wherein the low resistance route is an electrode of the set of electrodes extending from the fifth terminal to the sixth terminal.

18. The dual component device of claim 9, wherein the second surface of the dual component device is configured to be coupled to an electrical component via the third terminal and the sixth terminal.

19. A method to assemble filter circuitry comprising:
producing a dual component device comprising:
  a passive component comprising:
    a first surface and a second surface opposite the first surface;
    a first electrode disposed within the dual component device extending from the first surface to the second surface; and
    a second electrode disposed within the dual component device, the second electrode terminating within the passive component; and
  attaching an electrical component to the dual component device such that a terminal of the electrical component is coupled to the second surface of the passive component via the first electrode; and
  attaching the dual component device to a printed circuit board, wherein the electrical component is physically separated from the printed circuit board, and the first surface of the passive component is coupled to the printed circuit board via the first electrode.

20. The method of claim 19, wherein the passive component comprises a capacitor and the electrical component comprises an inductor.

* * * * *